United States Patent

Wake

Patent Number: 5,756,239
Date of Patent: May 26, 1998

[54] METHOD OF FORMING A COLOR FILTER ARRAY WITH IMPROVED RESOLUTION

[75] Inventor: Ronald W. Wake, Hilton, N.Y.

[73] Assignee: Eastman Kodak Company, Rochester, N.Y.

[21] Appl. No.: 764,423

[22] Filed: Dec. 12, 1996

[51] Int. Cl.⁶ .................................................. G02B 5/20
[52] U.S. Cl. ................................................ 430/7; 216/24
[58] Field of Search ............................ 430/7, 321, 323, 430/325; 216/24; 349/106

[56] References Cited

U.S. PATENT DOCUMENTS

| | | | |
|---|---|---|---|
| 4,782,008 | 11/1988 | Babich et al. | 430/313 |
| 4,808,501 | 2/1989 | Chiulli | 430/7 |
| 5,059,500 | 10/1991 | Needham et al. | 430/7 |
| 5,140,396 | 8/1992 | Needham et al. | 357/30 |
| 5,321,249 | 6/1994 | Nomura | 250/208 |
| 5,407,786 | 4/1995 | Ito et al. | 430/313 |
| 5,419,990 | 5/1995 | Wake et al. | 430/7 |
| 5,466,926 | 11/1995 | Sasano et al. | 250/216 |

FOREIGN PATENT DOCUMENTS 57-004012  1/1982  Japan.
61-41102  8/1984  Japan.

OTHER PUBLICATIONS

Abali et al, Metallized Photoresists: A New Approach to Surface Imaging. Microelectronic Engineering. 13, pp. 93–96, 1991.

McColgin et al, Advances in Resist Technology and Processing V, SPIE Proceedings, 920, pp. 260–267, 1988.

*Primary Examiner*—John A. McPherson
*Attorney, Agent, or Firm*—Raymond L. Owens

[57] ABSTRACT

For use in forming a high resolution color filter array the following steps are used: coating a colored layer containing a binder, a colorant in the binder, the binder being transparent over the entire visible electromagnetic spectrum and remaining so even after extended treatment with elevated temperature and light; hardening the colored layer; providing and patterning a photoresist layer over the hardened colored layer; and treating the patterned photoresist layer so that it is selectively resistant to oxygen plasma etch. Further processing steps are used to complete the colored filter array.

9 Claims, 3 Drawing Sheets

METHOD OF FORMING A COLOR FILTER ARRAY WITH IMPROVED RESOLUTION

FIELD OF THE INVENTION

This invention relates to color filter arrays with improved resolution.

BACKGROUND OF THE INVENTION

Color filter arrays are patterns of color patches used to separate out the wavelength range of incident light that is needed in the corresponding individual picture areas (pixels). Common uses of color filter arrays are in color CRTs, flat panel displays, and electronic imagers. The colors used are usually the primary colors (red, green, and blue), the complementary colors (cyan, magenta, and yellow), or some combination thereof. The size of the color patches varies depending on the application. For CRTs and flat panel displays the size is relatively large since these systems are used for viewing with the naked eye. Electronic imagers however are used in camera systems that focus the light thus they require smaller color patches to achieve sufficient resolution to produce a pleasing image when the pictoral information is enlarged for viewing.

Color filter arrays for electronic imagers are presently fabricated on top of the photoelectronic sensor by patterning a photosensitive resin which contains a mordant. The patterned resin is then subjected to a solution of ionic dye having a charge opposite to that of the mordant. See for example, commonly assigned U.S. Pat. No. 5,419,990, issued May 30, 1995 to Wake et al. This dye soaks into the patterned layer and becomes bound to the mordant sites. This type of process inherently limits the resolution of the color filter array pattern since the act of imbibing the dye also swells the patterns. In addition to swelling the pattern, this process also leaves very uneven edges to the patterns. This, in turn, limits how close the individual color patches can be placed to one another.

Although the prior art shows techniques for improving the resolution of color filter array patterns, it has still has a number of drawbacks. For example, Chiulli, U.S. Pat. No. 4,808,501, starts with the dye already dissolved in the photoresist used to define the pattern. The photoresist is the diazonaphthoquinone/novolak system widely used in semiconductor manufacturing. Exposure to ultraviolet light causes a photochemical reaction which results in the exposed areas becoming soluble in aqueous base whereas the unexposed areas are not. Thus exposure through a patterned mask and development with aqueous base results in a pattern of dyed photoresist which can be high resolution. A drawback of this invention is that the selection of dyes can not include any that absorb the wavelengths of light needed to pattern the photoresist. Another problem with this arrangement is the inherent visible coloration of the photoresist. The photoresist tends to absorb some blue light and is therefore slightly yellow in color which will interfere with the desired color imparted by the added dye. This could be compensated for if it were stable but the novolak resin in the photoresist tends to yellow more upon exposure to heat and light. This instability is not a drawback for its use in patterning in semiconductor manufacturing since it is removed after the patterning is complete. These types of problems are likely in any system when one material is responsible for more than one important property.

Needham et al., U.S. Pat. Nos. 5,059,500 and 5,140,396, correct these problems by using separate layers for the dye and the photoresist. The desired dye is dissolved in a solution of a binder in a solvent with good coating properties. The binder is chosen to be compatible with the dye and solvent as well as having no interfering absorption in the visible electromagnetic spectrum either initially or after aging. This solution of dye and binder is first coated on the substrate preferably by depositing some in the center then spinning the substrate at high speed. This results in a thin film of the solution which is easily dried leaving just the dye dispersed in the binder. A material is deposited having different plasma etch characteristics than the dye and binder mixture. This is usually a silicon oxide which is widely used in semiconductor manufacturing and is known to be resistant to plasma etching using oxygen which will readily etch materials with high carbon content. The patterning method also involves a photoresist which is in-turn coated on top of the silicon oxide. Exposure through a patterned mask and development with aqueous base results in a pattern in the top photoresist layer only. The transfer of this pattern to the underlying dyed layer is accomplished in two separate etch steps. First, a plasma etch with a fluorine-containing gas is used to transfer the pattern to the intermediate silicon oxide layer then an oxygen plasma etch is done to both transfer the pattern to the dyed layer and remove the remaining photoresist. The result is a patterned dye layer with a silicon oxide cap. This cap remains to serve as a barrier protecting the dyed layer from further processing steps needed to form other dyed layers of different colors. This process is indeed capable of high resolution color filter patterns and has relatively few limitations on the dyes and binders that can be used. However, the multiple coating and etching steps needed make it a long and expensive process. There are very few commercial processes in use that require this level of complexity.

The complexity and cost would be reduced considerably by limiting the number of layers to two, the colored layer and an overcoated photoresist for patterning. This possibility is mentioned by Nomura, U.S. Pat. No. 5,321,249, Sasano et al., U.S. Pat. No. 5,466,926, and Sasamori et al., Kokai Patent No. 61-41102 but none teach how to accomplish it. Both the colored layer and the photoresist have high carbon content and as such would be resistant to fluorine-containing plasmas and readily etched by those containing oxygen. Since plasma etching is the best choice for obtaining high resolution images, the prior art gives no indication as how to accomplish high resolution imaging of color filter arrays.

SUMMARY OF THE INVENTION

It is an object of the present invention to provide a method for limiting the number of layers and producing high resolution color filter arrays requiring reduced process complexity and cost.

It is another object of the present invention to provide a high quality color filter array whereby the colorant and binder are chosen to give good color and stability performance and not required to be patternable.

These objectives are achieved by a method of forming a high resolution color filter array the improvement comprising:

(a) coating a colored layer containing a binder, a colorant in the binder, the binder being transparent over the entire visible electromagnetic spectrum and remaining so even after extended treatment with elevated temperature and light;

(b) hardening the colored layer;

(c) providing and patterning a photoresist layer over the hardened colored layer; and (d) treating the patterned photoresist layer so that it is selectively resistant to oxygen plasma etch.

ADVANTAGES

It is an advantage of the present invention to efficiently form a color filter array using a method which reduces the number of needed layers while providing high resolution color filter arrays.

DETAILED DESCRIPTION OF THE PREFERRED EMBODIMENTS

Figure 1A:
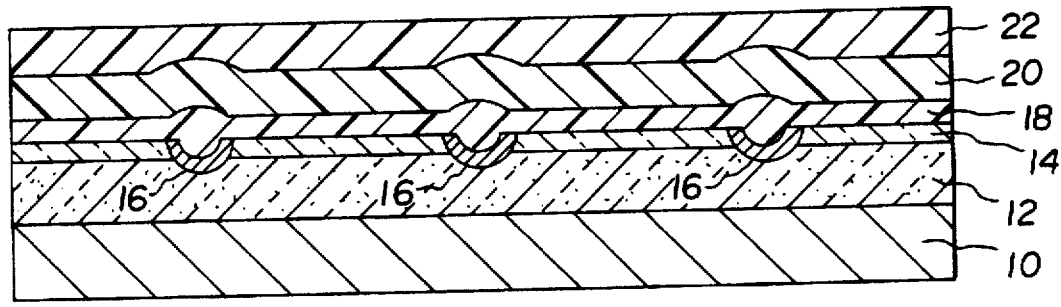
FIGS. 1A–1C show cross-sectional views of an electronic imager depicting the steps in the process of forming color filter arrays using the prior art.

In accordance with the present invention, the colored layer is coated at the desired thickness usually by spin coating after which the layer is preferably hardened to make it more resistant to subsequent processing. This hardening can be accomplished by increasing the molecular weight of the binder by exposure to either heat or light. The photoresist layer is then coated over the colored layer again preferably by spin coating. The photoresist is exposed through a patterned mask to electromagnetic radiation capable of causing a chemical change. The chemical difference between the exposed and unexposed regions of the photoresist is then used to alter the etch characteristics so that the exposed and unexposed regions will have widely different resistance to oxygen plasma etching. Examples of treatments which will alter the etch characteristics include exposure to organometallic molecules, especially multifunctional organometallic molecules, as described by Babich, et al. (U.S. Pat. No. 4,782,008). Also, Abali, et al. (*Microelectronic Engineering*, 13, 93–96 (1991)) describe a method of selective metal plating. The subsequent plasma etching with oxygen will cause removal of certain areas of the photoresist allowing continued removal of the underlying colored layer whereas those areas of the photoresist made resistant to oxygen plasma etching will remain as will the colorant below them. The next step is to prepare for the second color. The details of this will vary depending on the characteristics of the materials used. If the photoresist does not possess any unwanted color then nothing is required and the next color can now be coated. Another possibility is that any unwanted color in the photoresist could be removed with a short exposure to ultraviolet light which is the case for the positive photoresists commonly used in the semiconductor industry. The most complicated situation arises if the photoresist has to be removed before the next color can be applied. This can involve extensive screening of treatments to find one that will remove the photoresist and not attack the underlying colored layer.

Variations of the above method still within the scope of the present invention include a development step after exposure of the photoresist. This forms a pattern of photoresist which can then be treated to alter its etch characteristics. (ref.: McColgin, et al., *SPIE Proceedings*, 920, 260–267 (1988)).The advantages of this variation are that there is a visible pattern to inspect prior to etch so that if errors occur a rework will be less complicated. Also, this variation does not rely on a significant difference in the reaction of the exposed and unexposed photoresist to the reagent producing the etch characteristic alteration. The disadvantage of this variation is that it requires another processing step to accomplish the development. Another variation would be to use a photoresist that already has components that make it resistant to oxygen plasma treatment. For this variation the development after exposure would again be necessary however no subsequent treatment is needed before the oxygen plasma. Such photoresists are not common due to there reduced patterning performance. As mentioned above, it is not desirable to require one layer to perform more than a single function, however, this is considered an option within the scope of this invention.

In a preferred embodiment of the present invention, illustrated in FIGS. 2A–2F, a method is provided by which a color filter array of high resolution and optimum color which is especially suitable to be applied to an electronic image sensor in a minimum number of processing steps.

Figure 1B:
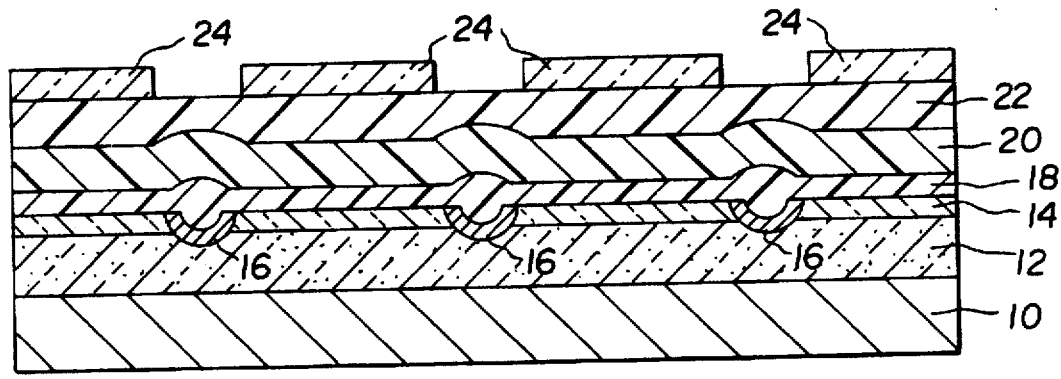
Figure 1C:
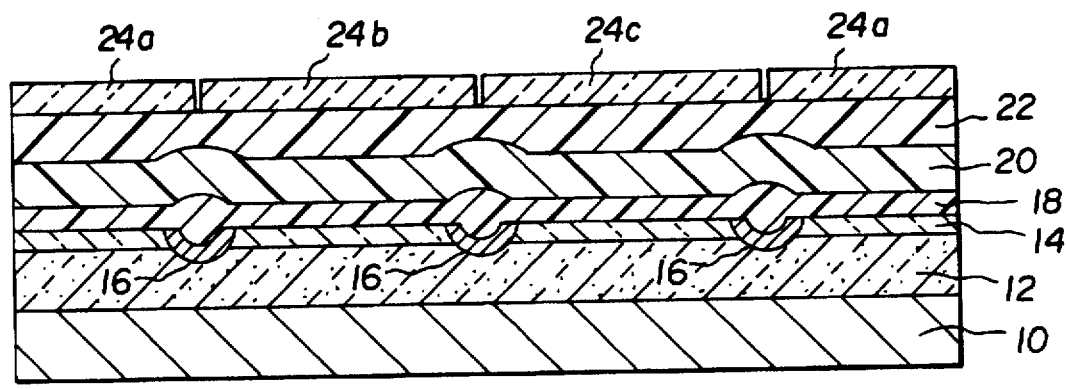

Referring to FIGS. 1A–1C, which show a prior art method. FIG. 1A shows the semiconductor portion of a typical electronic imager. It consists of a substrate 10, usually doped with an n-type material, a p-well 12 which is just the substrate material, usually silicon, doped with a p-type material, and photodiodes 14 separated from one another by channel stops 16. Overlying layers 18 and 20 provide isolation and protection for the lightshield and conducting lines needed to contact the individual picture elements, pixels. These portions of the electronic imager would appear in a cross-sectional view along a different axis. An uppermost planarization layer 22 is shown in FIG. 1A This is necessary to provide a level surface on which the color filter array can be applied since thickness variations are very detrimental to the performance characteristics of color filter arrays.

In FIG. 1B, the undyed binder of a color filter array 24 is shown after the necessary patterning steps. This illustration is unrealistic since color filter array 24 is shown for all colors simultaneously whereas in actual practice it is required to be applied sequentially for each color and dyed before the next layer is coated and patterned. However, it is done this way to better illustrate the adjustments necessary with the prior art to obtain patterns with accurate final dimensions. In the process of forming an undyed color filter array 24 involves soaking the pattern in a solution containing a dye and sometimes also agents that swell the pattern, the final dimensions of the color filter pattern will be larger than those of the undyed pattern. This both limits how small of a pixel can be accurately covered with a filter element and reduces the controllability of the process. FIG. 1C shows an accurately positioned color filter array with 3 colors, 24a, 24b, and 24c, but it should be appreciated that obtaining this accuracy with the prior art is very difficult.

Figure 2A:
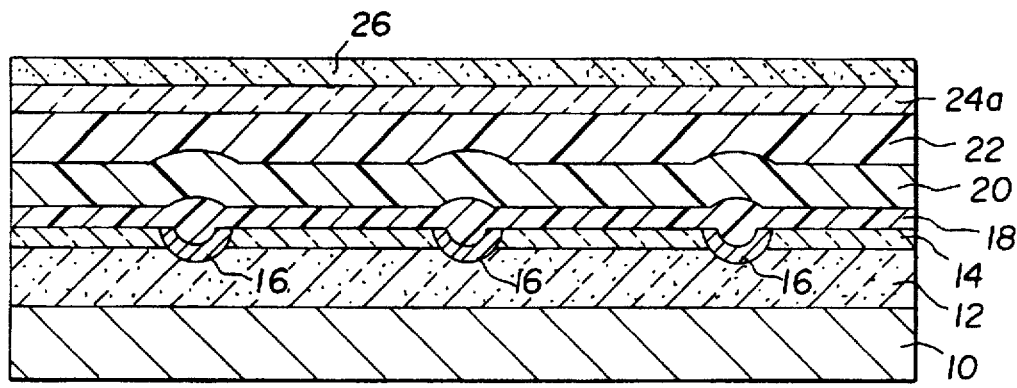
FIGS. 2A–2F show cross-sectional views of an electronic imager during the steps of forming a color filter array according to the present invention.
Figure 2B:
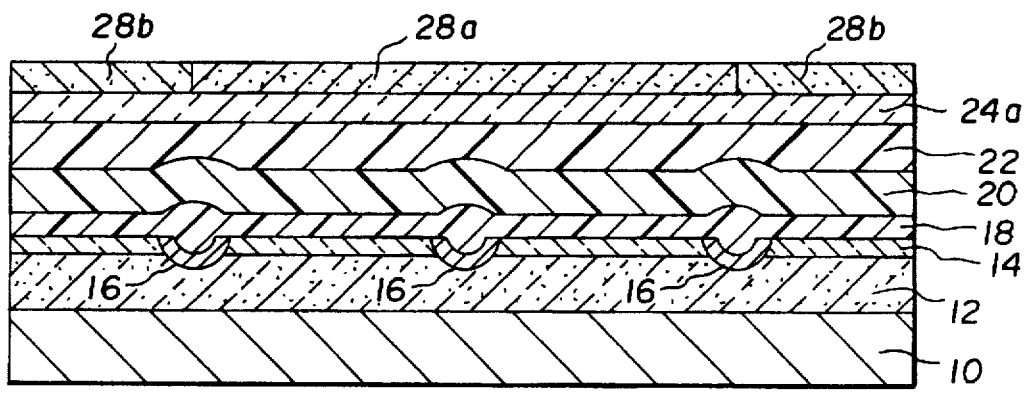

Referring to FIG. 2A where parts correspond to those previously discussed, the same numbers will be used. The method of the present invention starts with coating a first colored layer 24a directly over the planarizing layer 22 at the desired thickness preferably by spin coating. After coating, the first colored layer 24a is preferably hardened to make it more resistant to subsequent processing. This hardening can be accomplished by increasing the molecular weight of the binder by exposure to either heat or light. The first colored layer 24a already contains the necessary colorant (dye or pigment) to render it the desired color. Over it is coated a photoresist layer 26, preferably by spin coating, which is reactive towards at least part of the electromagnetic spectrum. Exposure of the homogenous photoresist layer 26 to the portion of the electromagnetic spectrum to which it is reactive, projected through a patterning mask, results in areas of the photoresist areas 28a and 28b in FIG. 2B, that contain different chemical species. This chemical difference permits selective treatment with reagents that will produce a difference in etch rate of photoresist areas 28a and 28b when exposed to an oxygen-containing plasma. Examples of treatments which will alter the etch characteristics include exposure to organometallic molecules, preferably multifunctional organometallic molecules in either liquid or vapor phase, as described by Babich, et al. (U.S. Pat. No. 4,782,008). Also, Abali, et al. (*Microelectronic Engineering*, 13, 93–96 (1991)) describe a method of selective metal plating.

Variations within the scope of the present invention at this point include removal of the more soluble portion of the photoresist layer in an appropriate liquid solvent. This would add another step to the process but would produce a couple of advantages. One is that a visible image would be formed at this point which could be readily inspected for any defects or mistakes in processing. Also, it would remove the requirement that the treatment be selective towards either photoresist areas 28a or 28b in producing the layer that is resistant to etching with an oxygen-containing plasma. Another variation within the scope of the invention at this point would be that the photoresist layer 26 is already composed of materials that make it resistant to an oxygen-containing plasma. For this variation the preferred component would be silicon since it is readily incorporated into organic materials and when exposed to an oxygen-containing plasma forms its oxide which inhibits further etching. Such silicon-containing photoresists are known in the art, however their stability and imaging properties are not optimum. It is believed that, even though not optimum, the stability and imaging properties of a silicon-containing photoresist would be sufficient for use in an application of the present invention.

Figure 2C:
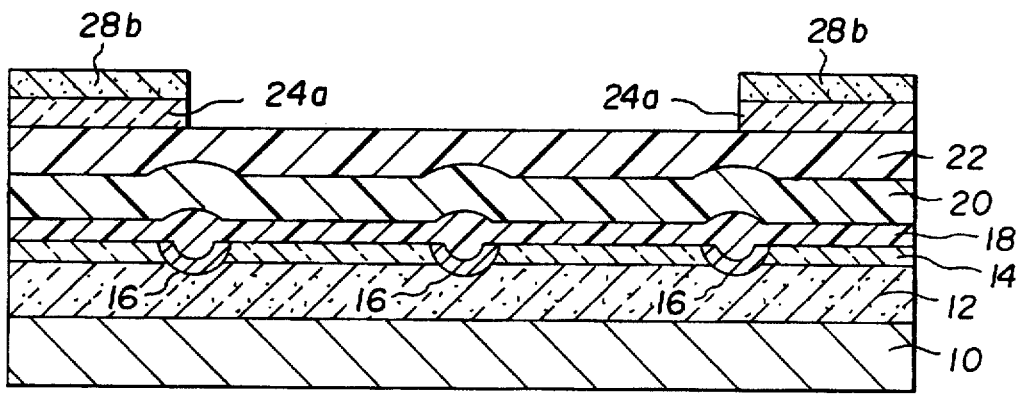

In this particular illustration of the present invention it is photoresist area 28b that is made resistant to etching by an oxygen-containing plasma. FIG. 2C shows the cross-section after etching in an oxygen-containing plasma and it can be seen that both the photoresist area 28a and the underlying colored layer 24a have been etched away. This completes the patterning of the first color provided that the photoresist area 28b has the appropriate properties that would allow it to remain on the electronic imager. These would include being transparent to the visible portion of the electromagnetic spectrum and stable to the heat and light treatments that the electronic imager would be exposed to in both the remaining fabrication and packaging steps as well as during its useful lifetime. Since the photoresist area 28b does contain the necessary etch resistance, it is preferable that it remain. This makes it important to carefully consider all the requirements when choosing the photoresist.

Figure 2D:
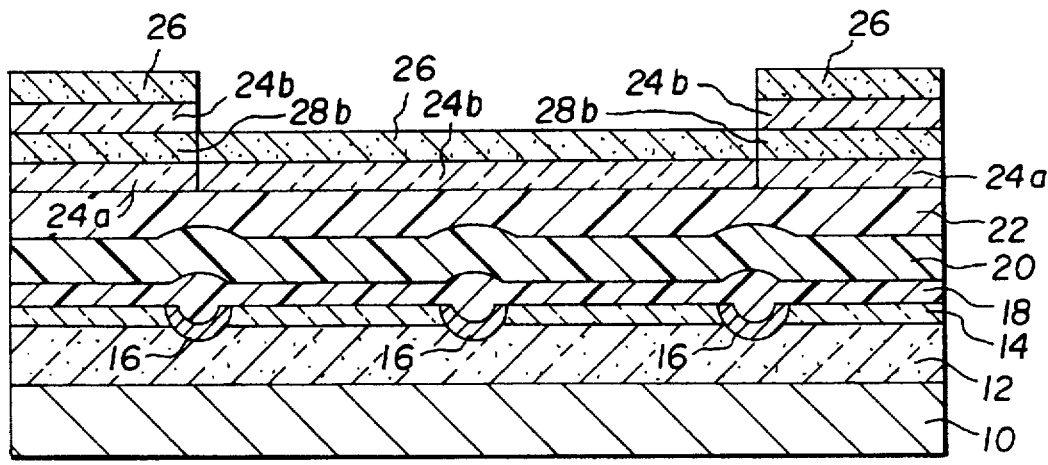
Figure 2E:
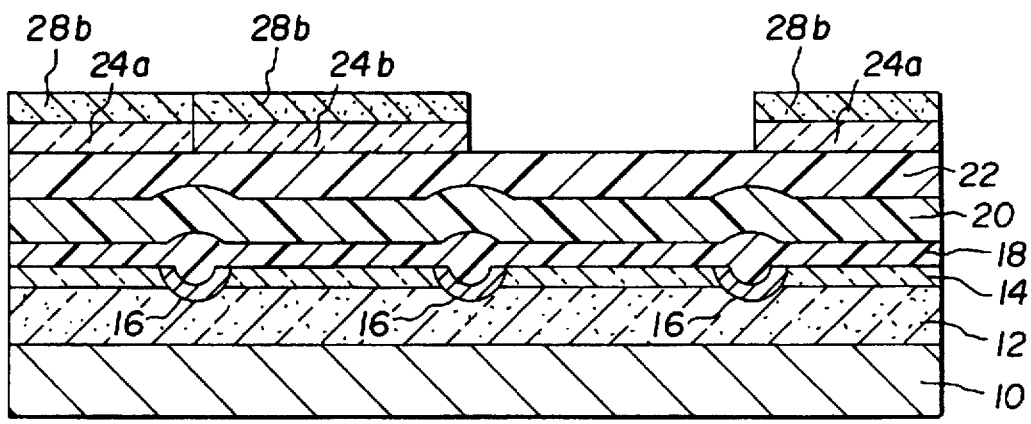

Referring to FIG. 2D, the layers necessary for the second color are then coated, again preferably by spin coating. These include the second colored layer 24b which is a polymeric binder containing a colorant such as a dye or pigment of the desired color. The photoresist layer 26 is coated over the second colored layer 24b. The same patterning steps used for the first colored layer 24a are then repeated to form the desired pattern in the second colored layer 24b. These include exposure of the photoresist layer 26 to electromagnetic radiation through a mask, formation of the etch resistant portion of the photoresist layer, 28b, by any of the various techniques detailed previously, and using an oxygen-containing plasma to etch away any photoresist layer 28a and underlying second colored layer 24b. FIG. 2E shows the resulting cross-section after the second colored layer 24b is patterned.

Figure 2F:
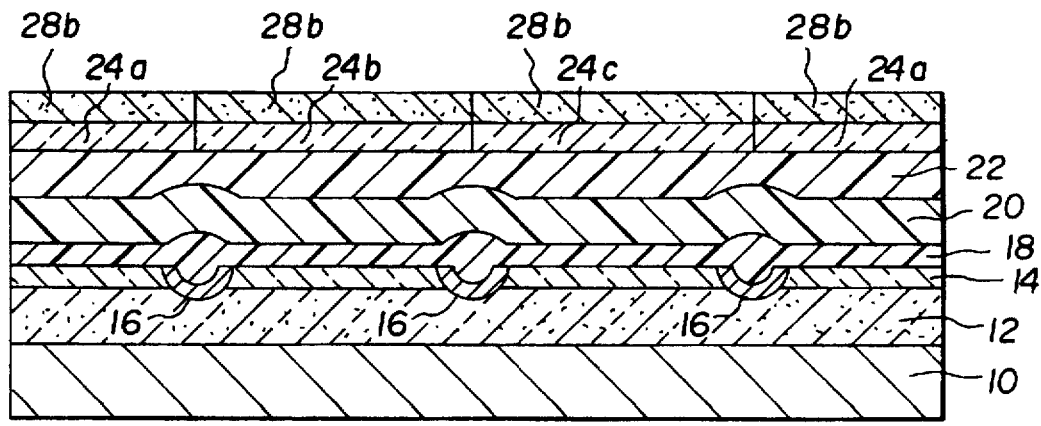

Most applications of color filter arrays, both image capture and image display, will require at least three colors. In the present invention the third and subsequent colors, if necessary, are applied in the same manner as the first two colors. FIG. 2F shows the cross-section of an electronic imager with a third colored layer, 24c, applied and pattern in the same manner as the first two colors.

The invention has been described in detail with particular reference to certain preferred embodiments thereof, but it will be understood that variations and modifications can be effected within the spirit and scope of the invention.

Parts List 10 substrate
12 p-well
14 photodiodes
16 channel stops
18 overlying layer
20 overlying layer
22 planarization layer
24 color filter array
24a color filter array color
24b color filter array color
24c color filter array color
26 photoresist
28a photoresist
28b photoresist

I claim:

1. In a method of forming a high resolution color filter array the improvement comprising:
    (a) coating a colored layer containing a binder, a colorant in the binder, the binder being transparent over the entire visible electromagnetic spectrum and remaining so even after extended treatment with elevated temperature and light;
    (b) hardening the colored layer;
    (c) providing and patterning a photoresist layer over the hardened colored layer; and
    (d) treating the patterned photoresist layer so that it is selectively resistant to oxygen plasma etch.

2. A method of forming a high resolution color filter array comprising:
    (a) coating a colored layer containing a binder, a colorant in the binder, the binder being transparent over the entire visible electromagnetic spectrum and remaining so even after extended treatment with elevated temperature and light;
    (b) hardening the colored layer;
    (c) providing and patterning a photoresist layer over the hardened colored layer;
    (d) treating the patterned photoresist layer so that it is selectively resistant to oxygen plasma etch;
    (e) oxygen plasma etching to etch any non-resistant photoresist areas and the corresponding areas of the underlying colored layer whereby a patterned colored layer is formed; and
    (f) repeating steps (a)–(e) to form a second patterned color layer for the color filter array.

3. A method of forming a high resolution color filter array comprising:
    (a) coating a colored layer containing a binder, a colorant in the binder, the binder being transparent over the entire visible electromagnetic spectrum and remaining so even after extended treatment with elevated temperature and light;

(b) hardening the colored layer;

(c) providing and patterning a photoresist layer over the hardened colored layer;

(d) treating the patterned photoresist layer so that it is selectively resistant to oxygen plasma etch; and (e) oxygen plasma etching to etch any non-resistant photoresist areas and the corresponding areas of the underlying colored layer whereby a patterned colored layer is formed; and (f) iteratively repeating steps (a)–(e) to form a plurality of different patterned color layers for the color filter array.

4. A method of forming a high resolution color filter array comprising:

(a) coating a colored layer containing a binder, a colorant in the binder, the binder being transparent over the entire visible electromagnetic spectrum and remaining so even after extended treatment with elevated temperature and light;

(b) hardening the colored layer;

(c) providing and patterning a photoresist layer over the hardened colored layer;

(d) treating the patterned photoresist layer so that it is selectively resistant to oxygen plasma etch;

(e) oxygen plasma etching to etch any non-resistant photoresist areas and the corresponding areas of the underlying colored layer whereby a patterned colored layer is formed;

(f) removing the photoresist layer; and (g) repeating steps (a)–(f) to form a second patterned color layer for the color filter array.

5. The method of claim 4 further including the step of forming barriers to prevent colorant interference.

6. The method of claim 4 wherein the patterning of the photoresist layer includes only an exposure step.

7. The method of claim 4 where in the patterning of the photoresist layer includes exposure and development steps.

8. In a method of forming a high resolution color filter array the improvement comprising:

(a) coating a colored layer containing a binder, a colorant in the binder, the binder being transparent over the entire visible electromagnetic spectrum and remaining so even after extended treatment with elevated temperature and light;

(b) hardening the colored layer; and (c) providing and patterning a photoresist layer over the hardened colored layer, the photoresist layer being resistant to oxygen plasma etching.

9. A method of forming a high resolution color filter array comprising:

(a) coating a colored layer containing a binder, a colorant in the binder, the binder being transparent over the entire visible electromagnetic spectrum and remaining so even after extended treatment with elevated temperature and light;

(b) hardening the colored layer;

(c) providing and patterning a photoresist layer over the hardened colored layer, the photoresist layer being resistant to oxygen plasma etching;

(d) oxygen plasma etching to etch any non-resistant photoresist areas and the corrsponding areas of the underlying colored layer whereby a patterned colored layer is formed; and (e) repeating steps (a)–(d) to form a second patterned color layer for the color filter array.

* * * * *